United States Patent [19]

Somekh et al.

[11] Patent Number: 5,294,320
[45] Date of Patent: Mar. 15, 1994

[54] APPARATUS FOR CLEANING A SHIELD IN A PHYSICAL VAPOR DEPOSITION CHAMBER

[75] Inventors: Sasson Somekh; Dan Maydan, both of Los Altos Hills, Calif.

[73] Assignee: Applied Materials, Inc., Santa Clara, Calif.

[21] Appl. No.: 878,938

[22] Filed: May 5, 1992

Related U.S. Application Data

[60] Division of Ser. No. 644,462, Jan. 14, 1991, abandoned, which is a continuation of Ser. No. 477,788, Feb. 9, 1990, abandoned.

[51] Int. Cl.$^5$ ............................................. C23C 14/34
[52] U.S. Cl. ............................ 204/298.11; 204/298.08; 156/345
[58] Field of Search ................... 204/192.32, 298.31, 204/298.33, 298.34, 298.37, 298.08; 156/345, 643, 646

[56] References Cited

U.S. PATENT DOCUMENTS

| | | | |
|---|---|---|---|
| 4,380,488 | 4/1983 | Reichelderfer et al. | 156/643 |
| 4,438,188 | 3/1984 | Shimatani et al. | 430/128 |
| 4,522,674 | 6/1985 | Ninomiya et al. | 204/298.31 X |
| 4,657,616 | 4/1987 | Benzing et al. | 156/345 |
| 4,786,352 | 11/1988 | Bezing | 156/345 |
| 4,795,880 | 1/1989 | Hayes et al. | 219/121.52 |
| 4,816,113 | 3/1989 | Yamazaki | 156/643 |
| 4,820,377 | 4/1989 | Davis et al. | 156/643 |
| 4,878,994 | 11/1989 | Jucha et al. | 156/643 |
| 4,892,753 | 1/1990 | Wang et al. | 427/38 |
| 4,960,488 | 10/1990 | Law et al. | 156/643 |

FOREIGN PATENT DOCUMENTS

0248876 12/1985 Japan ........................... 204/298.11
63-176475 7/1988 Japan.

OTHER PUBLICATIONS

IBM Techanical Disclosure Bulletin, vol. 20 No. 3, Aug. 1977 EP Search Report.

Primary Examiner—Nam Nguyen
Attorney, Agent, or Firm—Birgit E. Morris

[57] ABSTRACT

In a method for in situ cleaning a shield bearing of excess target material deposited in a physical vapor deposition chamber, during a cleaning cycle, a vacuum is created in the physical vapor deposition chamber. A gas mixture which includes a reactive gas is introduced into the physical vapor deposition chamber. The reactive gas is activated by plasma discharge. During the cleaning, the gas mixture is continuously removed from the vapor deposition chamber along with reaction products.

6 Claims, 3 Drawing Sheets

5,294,320

APPARATUS FOR CLEANING A SHIELD IN A PHYSICAL VAPOR DEPOSITION CHAMBER

This is a division of application Ser. No. 07/644,462 filed Jan. 14, 1991 abandoned, which is a continuation of application Ser. No. 07/477,788 filed Feb. 9, 1990 abandoned.

BACKGROUND

The present invention concerns the cleaning of shields in a physical vapor deposition chamber.

In physical vapor deposition (PVD) processes a target material, for example tungsten, is bombarded by a gas, for example argon. Material from the target is dislodged and sputters onto a wafer.

A PVD chamber generally includes shields in the area immediately around a wafer. The shields prevent excess material sputtering from the target from contaminating the remainder of the PVD chamber.

The build-up of excess material on the shields eventually results in flaking. At this point it is usually necessary to service the PVD chamber by replacing the shield. If shield replacement needs to be done at approximately the same time as target replacement, the service to the shield may be performed without too much inconvenience. However, if the shield needs to be replaced much more often than the target, this can result in extra down-time of the system which can seriously impair production throughput.

Several methods have been tried to reduce flaking and thereby lengthen the time between shield replacement. For example, some shields have been designed to have a specific expansion coefficient. Additionally, the surface of shields has been treated, for example, by sandblasting. Adhesion layers also have been laid down to prevent flaking. Finally, shield design may be simplified to facilitate easy replacement.

SUMMARY OF THE INVENTION

In accordance with the preferred embodiment of the present invention, a method for in situ cleaning of excess target material deposited in a physical vapor deposition chamber is presented. During a cleaning cycle, a vacuum is created in the physical vapor deposition (PVD) chamber. A gas mixture which includes a reactive gas is introduced into the PVD chamber. The reactive gas is activated by plasma discharge, and is pumped out of the chamber with the reaction products.

The present invention allows for in situ cleaning of shields in a PVD chamber. Although sometimes used in chemical vapor deposition (CVD) processes, in situ cleaning of shields has not been attempted in prior art PVD chambers. This is because PVD processes typically are done in a high vacuum, which is not conducive to using etchant to clean a shield. Additionally, in the prior art, shields have often included many parts making it difficult to uniformly etch material from them. Also, in order to effectively etch a shield without removing an excess amount of the target, there must be some way to increase bombardment of the etchant on the shield while decreasing bombardment of the etchant on the target. The preferred embodiment of the present invention solves all of the issues. In the preferred embodiment of the present invention, during a cleaning cycle the vacuum which is created in the PVD chamber is less than that used for typical PVD processes. The shield is designed from a few pieces of conductive material providing for uniform etching. Also, during the cleaning cycle, a negative voltage potential is placed on the shield so that there is increased bombardment of etchant on the shield.

Alternate embodiments of the present invention include applying a radio frequency voltage to an electrode within the PVD chamber to activate the reactive gas, and upstream activation of the reactive gas in a special activation chamber.

DESCRIPTION OF THE PREFERRED EMBODIMENT

Figure 1:
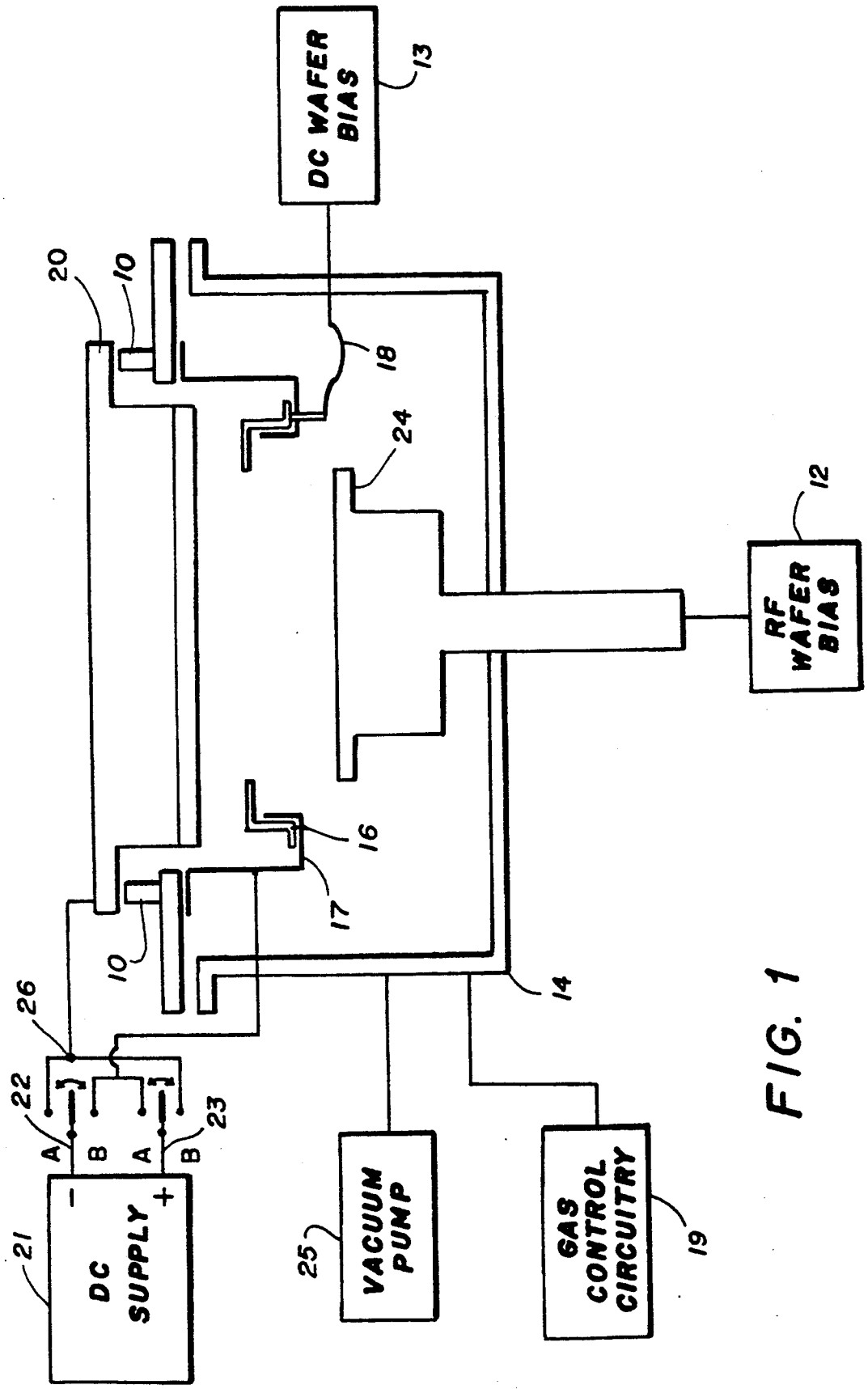
FIG. 1 is a simplified block diagram showing a physical vapor deposition chamber and related circuitry according to the preferred embodiment of the present invention.

In FIG. 1, a physical vapor deposition (PVD) chamber 14 includes a movable wafer table 24. During the course of processing a specimen, i.e., a wafer, is placed on wafer table 24. Wafer table 24 is raised through a sleeve 16 and a shield 17 to a processing location. An RF wafer bias circuit 12 provides an RF bias voltage to the wafer. A DC wafer bias circuit 13 provides a DC bias to the wafer through a line 18.

Gas control circuitry 19 controls the gas flow in and out of the chamber 14. A vacuum pump 25 is used to create a vacuum in the PVD chamber 14 during processing of wafers.

A target 20 may be composed of, for example, titanium tungsten. Target 20 is electrically isolated from the shield 17 and the rest of the PVD chamber 14 by insulation 10. A DC power supply 21 establishes a voltage potential between the shield 17 and target 20. A switch 26 alters the polarity of the voltage potential.

DC power supply 21 is floating so that neither the anode 23 or cathode 22 is grounded to PVD chamber 14.

When wafers are being processed switch 26 connects the cathode 22 of DC power supply 21 to the target 20. Process switch 26 connects the anode 23 to the shield 17. DC power supply 21 is used because gas in the form of plasma will be accelerated toward whatever surface is connected to the cathode 22. During physical vapor deposition argon gas is pumped through a port 29. The argon molecules collide with the target 20 and cause sputtering of the titanium/tungsten material which then deposits onto a wafer on the wafer table 24.

When the shield 17 is being cleaned in situ, the switch 26 connects the cathode 22 of DC power supply to PVD chamber 14 which is connected with the shield 17. Switch 26 also connects the anode 23 to the target 20. A gas mixture including a reactive gas, for example $NF_3$, $CF_4$, or $SF_6$, is introduced through port 29. The reactive gas is activated by plasma discharge, for example, by the electric field created by the DC power supply 21. The reactive gas etches the material on the shield 17. The flow rate of the gasses is approximately 100 SCCM. The atmospheric pressure within PVD chamber can be anywhere between 1 and 1000 millitorr. The time duration for the etch is typically between one and ten minutes. The resultant reactants are continuously pumped away.

Once the reactive gas has been removed, the switch 26 again connects the cathode 20 to the target 22 and the anode 23 to shield 17. Before any new wafers are placed in the PVD chamber 14, the target 20 may be bombarded by, for example, argon gas. This sputter cleaning of the target 20 will remove any reactive gas residues on the target 20 and expose new target material. The sputter cleaning also serves to seal the surfaces of the shield 17 and to act as a getter, removing and trapping gas impurities. During the sputter cleaning the PVD chamber 14 is under the high vacuum normally present when deposition is actually being done on a wafer.

Figure 2:
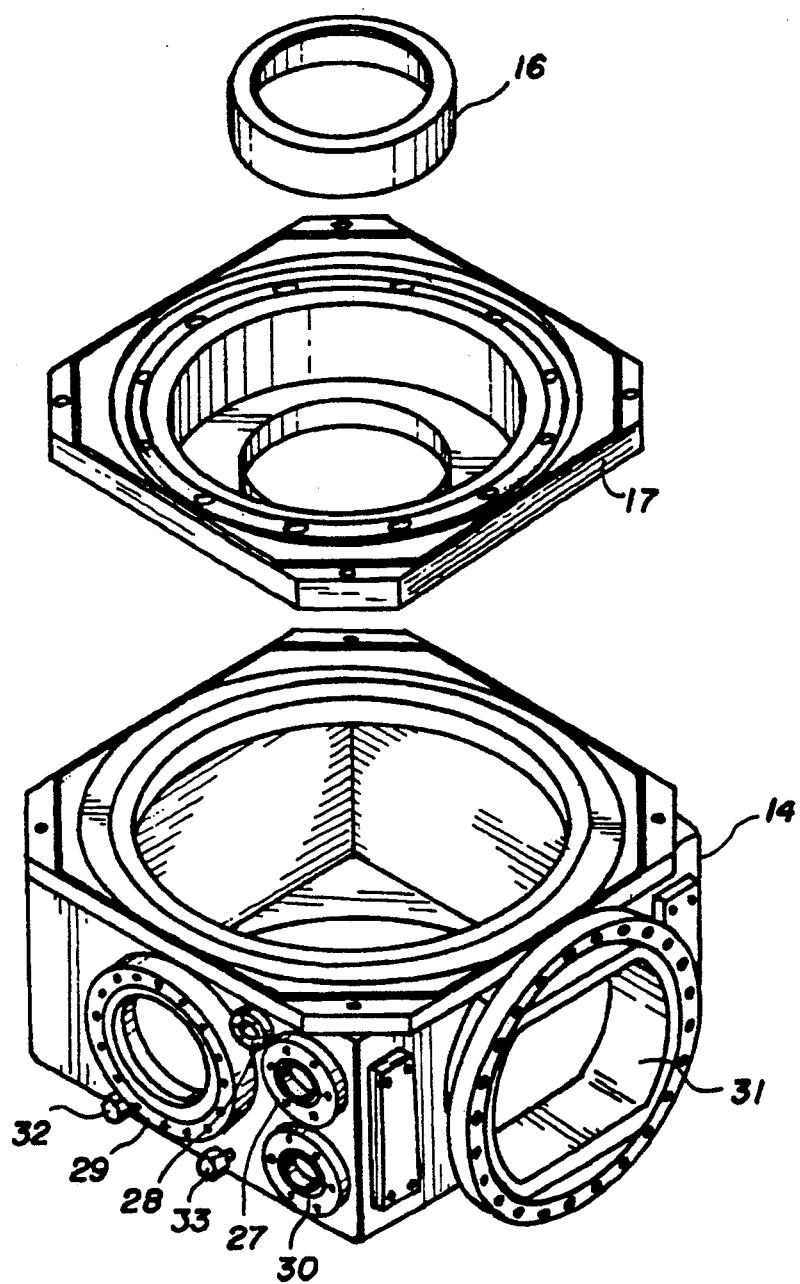
FIG. 2 shows a perspective view of a disassembled physical vapor deposition chamber in accordance with the preferred embodiment of the present invention.

FIG. 2 shows the PVD chamber 14, the shield 17 and a sleeve 16. Chamber 14 is shown to include ports 27, 28, 29, 30, 31, 32 and 33. Port 30 may be used, for example, by vacuum pump 25 or by a roughing pump for initial pumping to create a vacuum. Port 27 may be, for example, used by a residual gas analyzer. Port 28 may be, for example, used to allow a power line into the PVD chamber 14, for example, to power a lamp used in PVD. Port 33 may be used for venting. Port 31 may be used as a window. Port 32 may be used for supplying argon gas and reactive gas into the chamber 14. Wafers are placed in the PVD chamber 14 through the port 31 by automated machinery (not shown). Shield 17 was designed so that during cleaning there is a uniform surface for etching. Also when the shield 17 is being cleaned the negative voltage potential on the shield 17 is uniform across all parts of the shield 17.

In the preferred embodiment discussed herein a titanium tungsten target 20 is utilized. Many other materials may be used in the target, for example, titanium or tungsten. The present invention is also useful for cleaning shields for many different processes performed in the PVD chamber 14. When the target 20 is made of aluminum, for example, the process for cleaning would be the same as described above, except that a chlorine containing gas, such as $Cl_2$, or $BCl_3$, would be used for etching.

Figure 3:
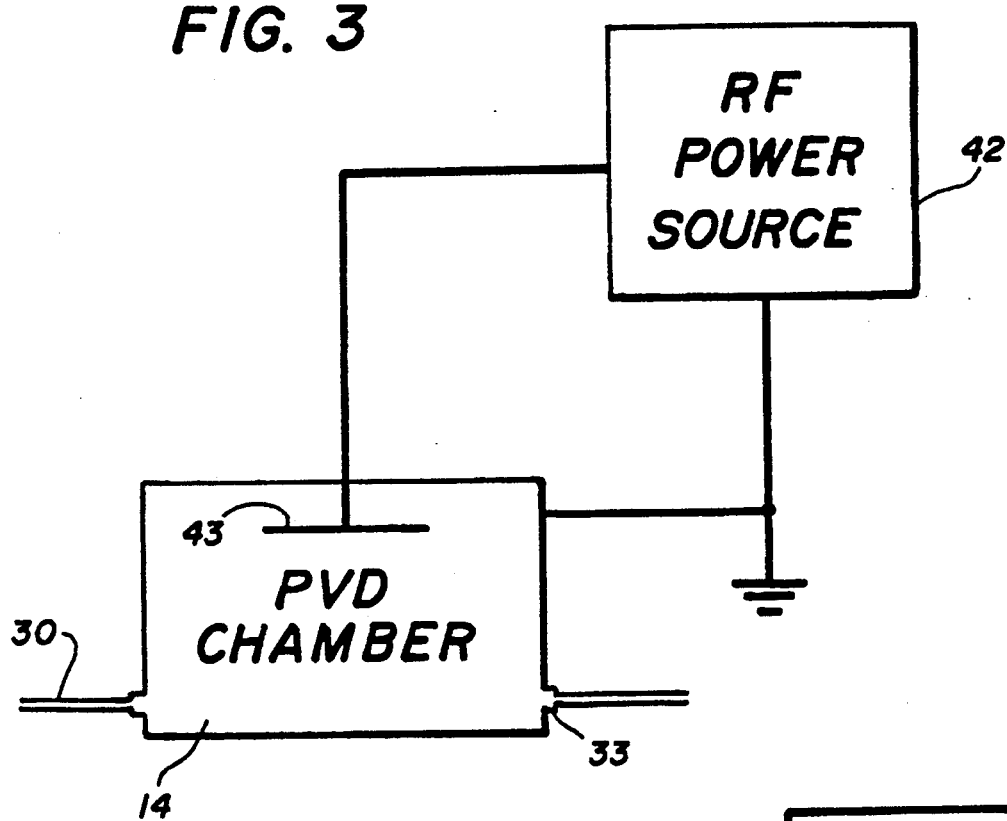
FIG. 3 shows a modification to the physical vapor deposition chamber and circuitry shown in FIG. 1 to allow for reactive gas activation by RF power in accordance with an embodiment of the present invention.

FIG. 3 shows an alternate embodiment of the present invention in which a radio frequency power source 42 is used activate the reactive gas within the PVD chamber 14. An RF power source 42 places an RF voltage on an electrode 43 which serves to activate the reactive gas by plasma discharge.

Figure 4:
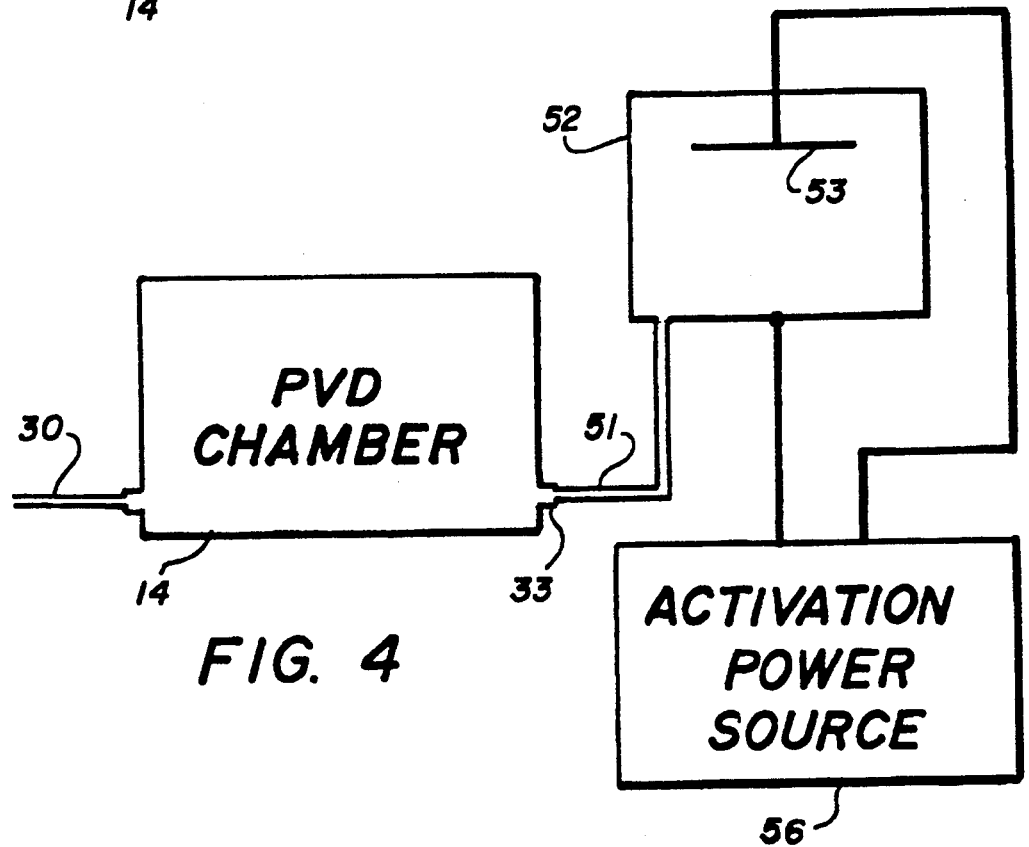
FIG. 4 shows a modification to the physical vapor deposition chamber and circuitry shown in FIG. 1 to allow for upstream activation of reactive gas in accordance with an embodiment of the present invention.

FIG. 4 shows an alternate embodiment of the present invention in which the reactive gas is activated in an upstream activation chamber 52. An activation power source 56 may use either DC or RF power placed on an electrode 53 to activate the reactive gas by plasma discharge. After activation of the reactive gas, the gas mixture containing the reactive gas is pumped through line 51, to the PVD chamber 14.

I claim:

1. An apparatus for physical vapor deposition comprising
   a) a housing capable of sustaining a high vacuum,
   b) a target within said housing of a material to be deposited, electrically connected to a DC power supply,
   c) a specimen support means within said chamber and below said target for supporting a specimen upon which said target material is to be deposited,
   d) a shield means surrounding said specimen support means and electrically connected to a DC power supply,
   e) means for supplying DC power to establish a potential between the shield means and the target,
   f) switch means for reversing the potential between the shield means and the target,
   g) means for introducing a reactive gas into said chamber, said reactive gas being capable of reacting with said target material to form gaseous by-products, and
   h) pumping means for removing said reactive gas and said by-products from said chamber.

2. An apparatus according to claim 1 including means of supplying DC voltage to an electrode within said housing to activate the reactive gas.

3. An apparatus according to claim 1 including means of supplying RF voltage to an electrode within said housing to activate the reactive gas.

4. An apparatus according to claim 1 including a separate activation chamber connected to said housing wherein said reactive gas is activated.

5. An apparatus according to claim 4 including means of supplying DC voltage to an electrode within said activation chamber to activate the reactive gas.

6. An apparatus according to claim 4 including means of supplying RF voltage to an electrode within said activation chamber to activate the reactive gas.

* * * * *